United States Patent [19]
Seo

[11] Patent Number: 5,926,707
[45] Date of Patent: Jul. 20, 1999

[54] METHODS FOR FORMING INTEGRATED CIRCUIT MEMORY DEVICES HAVING DEEP STORAGE ELECTRODE CONTACT REGIONS THEREIN FOR IMPROVING REFRESH CHARACTERISTICS

[75] Inventor: Young-woo Seo, Kyungki-do, Rep. of Korea

[73] Assignee: Samsung Electronics Co., Ltd., Rep. of Korea

[21] Appl. No.: 08/846,075

[22] Filed: Apr. 25, 1997

Related U.S. Application Data

[63] Continuation-in-part of application No. 08/764,202, Dec. 13, 1996.

[30] Foreign Application Priority Data

Dec. 15, 1995 [KR] Rep. of Korea ...................... 95/50683
Oct. 31, 1996 [KR] Rep. of Korea ...................... 96/51493

[51] Int. Cl.$^6$ ............................................. H01L 21/8234
[52] U.S. Cl. .................... 438/238; 438/250; 438/381; 438/393
[58] Field of Search ................................... 438/210, 223, 438/233, 413, 523, 546, 549 A, 238 B, 239, 240, 241, 250, 251–256, 381, 393–396, 397, 398, 399

[56] References Cited

U.S. PATENT DOCUMENTS

| 4,277,882 | 7/1981 | Crossley . |
| 4,716,126 | 12/1987 | Cogan ...................................... 437/24 |
| 5,187,122 | 2/1993 | Bonis . |
| 5,194,929 | 3/1993 | Ohshima et al. . |
| 5,198,386 | 3/1993 | Gonzalez .................................. 437/52 |
| 5,250,832 | 10/1993 | Murai ...................................... 257/306 |
| 5,276,346 | 1/1994 | Iwai et al. . |
| 5,389,558 | 2/1995 | Suwanai et al. ........................... 437/52 |
| 5,395,784 | 3/1995 | Lu et al. . |
| 5,569,616 | 10/1996 | Ohki et al. . |
| 5,770,497 | 6/1998 | Wu et al. . |
| 5,780,336 | 7/1998 | Son et al. ................................. 438/251 |
| 5,801,065 | 9/1998 | Rizvi et al. . |

Primary Examiner—Richard A. Booth
Assistant Examiner—Jonathan Hack
Attorney, Agent, or Firm—Myers Bigel Sibley & Sajovec

[57] ABSTRACT

Methods of forming DRAM memory devices include the steps of forming deep storage electrode contact regions to improve the refresh characteristics of DRAM memory cells therein. In particular, the methods include the steps of forming an array of DRAM memory cells in a field ion region of second conductivity type. These memory cells contain storage electrode contact regions and bit line contact regions of first conductivity type therein. An electrically insulating layer is then deposited on the memory cells. Storage electrode contact holes are formed in the electrically insulating layer to expose the storage electrode contact regions. Dopants of first conductivity type are then implanted through the storage electrode contact holes and into the storage electrode contact regions at a first energy in a range between about 60 and 150 KeV. Then, dopants of first conductivity type are again implanted through the storage electrode contact holes at a second higher energy in a range between about 200 and 450 KeV. These dual implanting steps are preferably performed to define deep storage electrode contact extensions which extend through the field ion region and form nonrectifying junctions with the semiconductor substrate. These storage electrode contact extensions improve the refresh characteristics of the memory cells in the array by compensating for parasitic electric fields and etching damage in the field ion region.

19 Claims, 9 Drawing Sheets

METHODS FOR FORMING INTEGRATED CIRCUIT MEMORY DEVICES HAVING DEEP STORAGE ELECTRODE CONTACT REGIONS THEREIN FOR IMPROVING REFRESH CHARACTERISTICS

CROSS-REFERENCE TO RELATED APPLICATION

This application is a continuation-in-part of application Ser. No. 08/764,202, filed Dec. 13, 1996, (Attorney Docket No. 5649-189) the disclosure of which is hereby incorporated herein by reference.

FIELD OF THE INVENTION

The present invention relates to semiconductor devices and methods of fabrication, and more particularly to methods of forming integrated circuit memory devices.

BACKGROUND OF THE INVENTION

Figure 1:
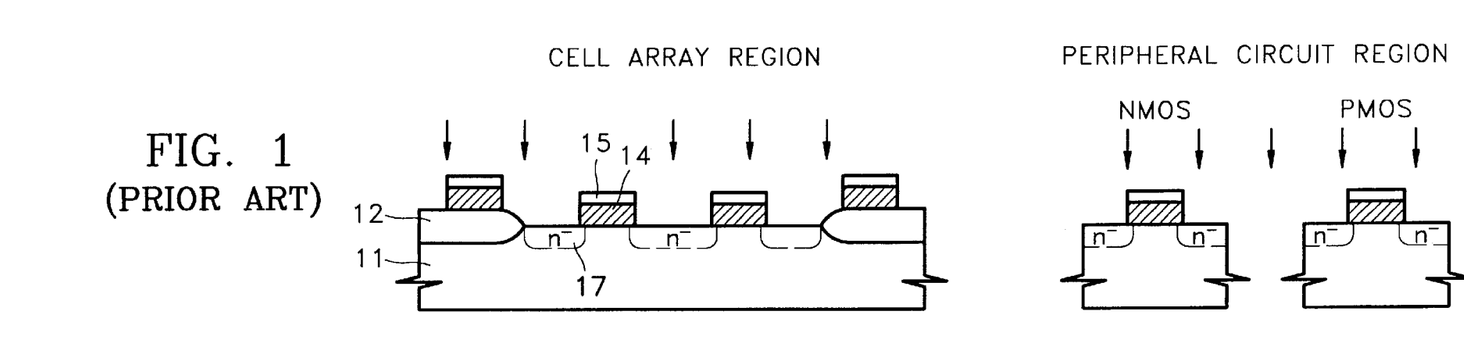
FIGS. 1–6 illustrate schematic cross-sectional views of intermediate structures illustrating a method of forming an integrated circuit memory device according to the prior art.

The reduction in DRAM memory cell refresh times at high integration densities is frequently caused by, among other things, parasitic short-channel induced charge leakage from the cell's storage capacitor. To address this reduction, attempts have been made to implant plug ions into the cell's contact regions to reduce leakage currents. A method according to one such attempt is illustrated by FIGS. 1–6. In particular, FIG. 1 illustrates a semiconductor substrate 11 having a cell array region and a peripheral circuit region. The cell array region is defined by a field oxide isolation region 12. This conventional method includes the steps of forming a blanket gate oxide film (not shown) on a face of the substrate 11. A conductive layer and insulating layer are then deposited and patterned to form insulated electrodes 14 having insulating caps 15 thereon. Next, lightly doped N-type regions 17 are formed by implanting N-type dopants into the substrate 11.

Figure 2:
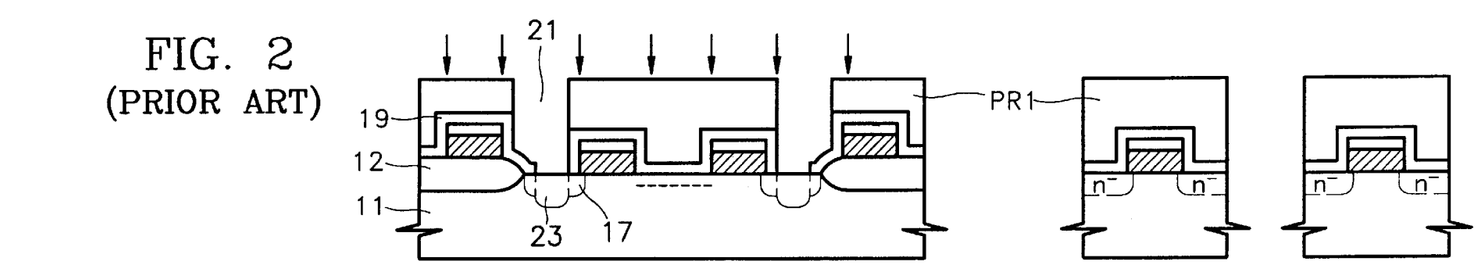
Figure 3:
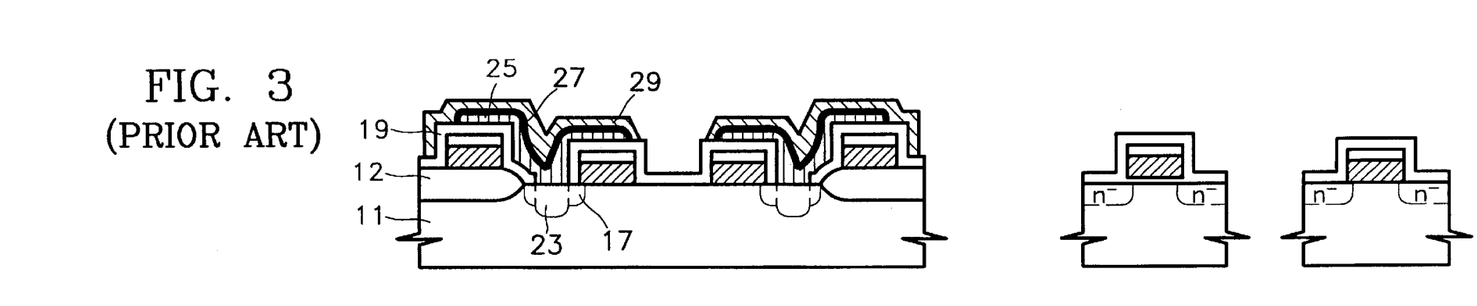

Referring now to FIG. 2, a blanket insulating film 19 is then deposited on the substrate 11. Then, a photoresist layer PR1 is patterned and used as an etching mask to form contact holes 21 in the blanket insulating film 19. A plug ion implanting step is then performed to reduce leakage currents from subsequently formed electrodes of storage capacitors, by recovering the damage generating in the semiconductor substrate 11 when the contact holes 21 were formed. Based on the plug ion implanting step, second impurity regions 23 are formed. Referring now to FIG. 3, the layer of photoresist PR1 is removed and then a layer of polysilicon is deposited in the contact holes 21 and patterned to form storage electrodes 25. Using conventional techniques, a dielectric film 27 and plate electrode 29 are then formed in sequence to complete the formation of storage capacitors.

Figure 4:
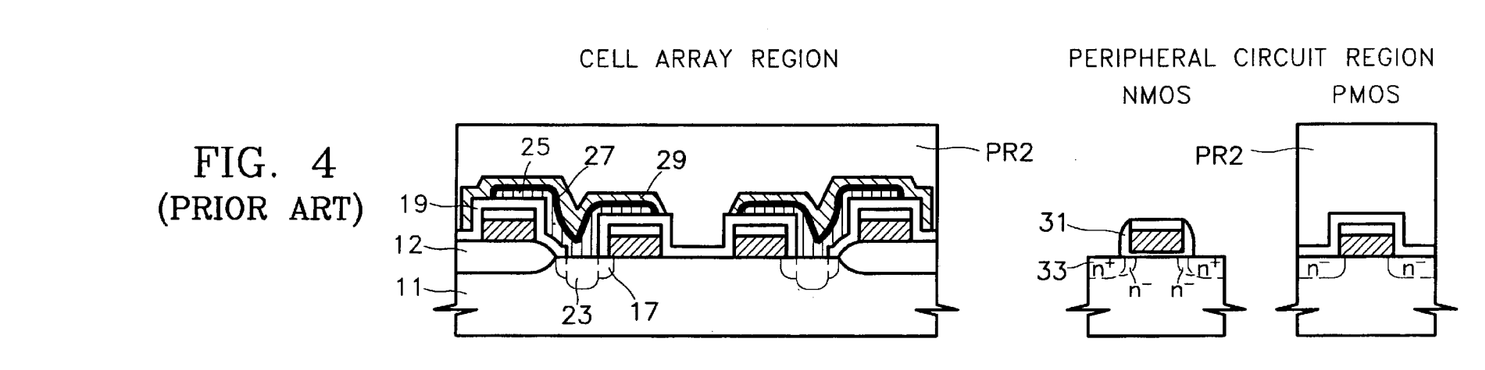
Figure 5:
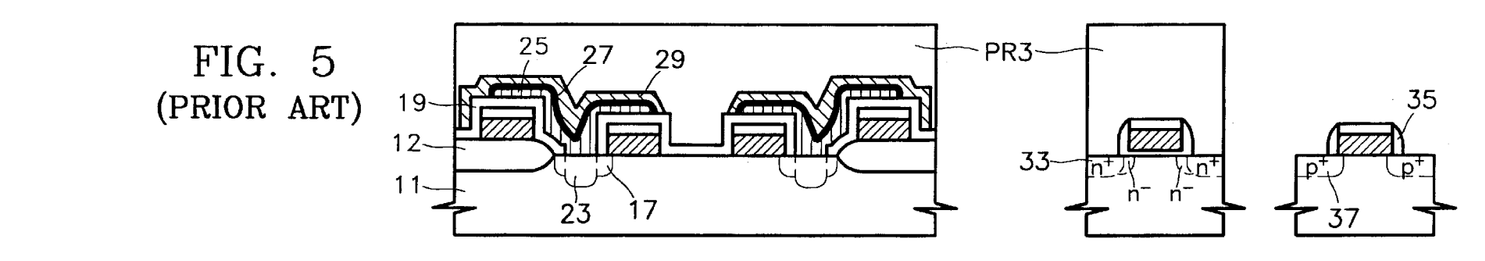

As illustrated best by FIG. 4, a second layer of photoresist is patterned to expose a portion of the peripheral circuit region where NMOS transistors are to be formed. A selective etching step is then performed to convert the exposed insulating film 19 to sidewall spacers 31 and then a self-aligned high dose implantation step is performed to form N-type source and drain regions 33. Similarly, as illustrated by FIG. 5, a third layer of photoresist is patterned to expose a portion of the peripheral circuit region where PMOS transistors are to be formed. A selective etching step is then performed to convert the exposed insulating film 19 to sidewall spacers 35. A self-aligned high dose implantation step is then performed to form P-type source and drain regions 37.

Figure 6:
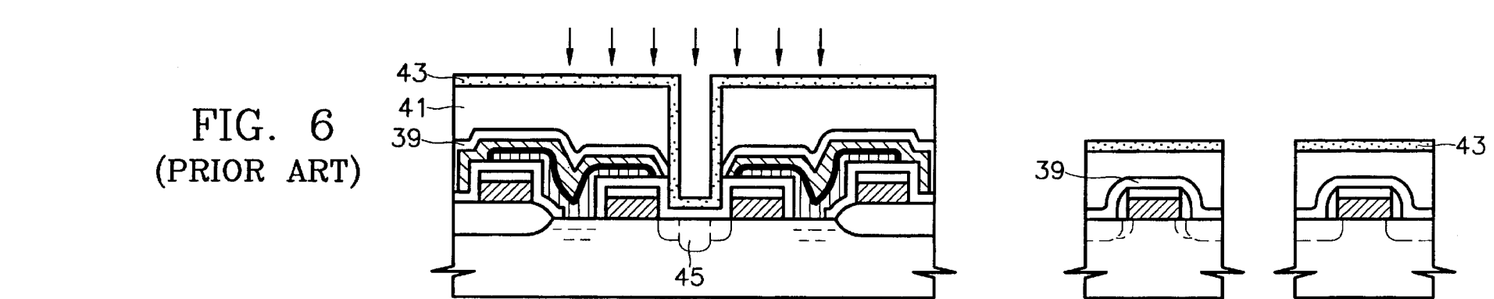

Finally, as illustrated best by FIG. 6, the third layer of photoresist is removed and then a blanket insulating film 39 is deposited. A planarization step is then performed using another insulating film 41 such as borophosphosilicate glass (BPSG). A layer of photoresist (not shown) is then patterned and used as an etching mask to form a bit line contact hole. A layer of undoped polysilicon is then deposited into the bit line contact hole and patterned to form a bit line 43. Thereafter, plug ions are implanted to reduce the contact resistance between the bit line 43 and the cell active area, and thereby form a bit line contact region 45.

Figure 19:
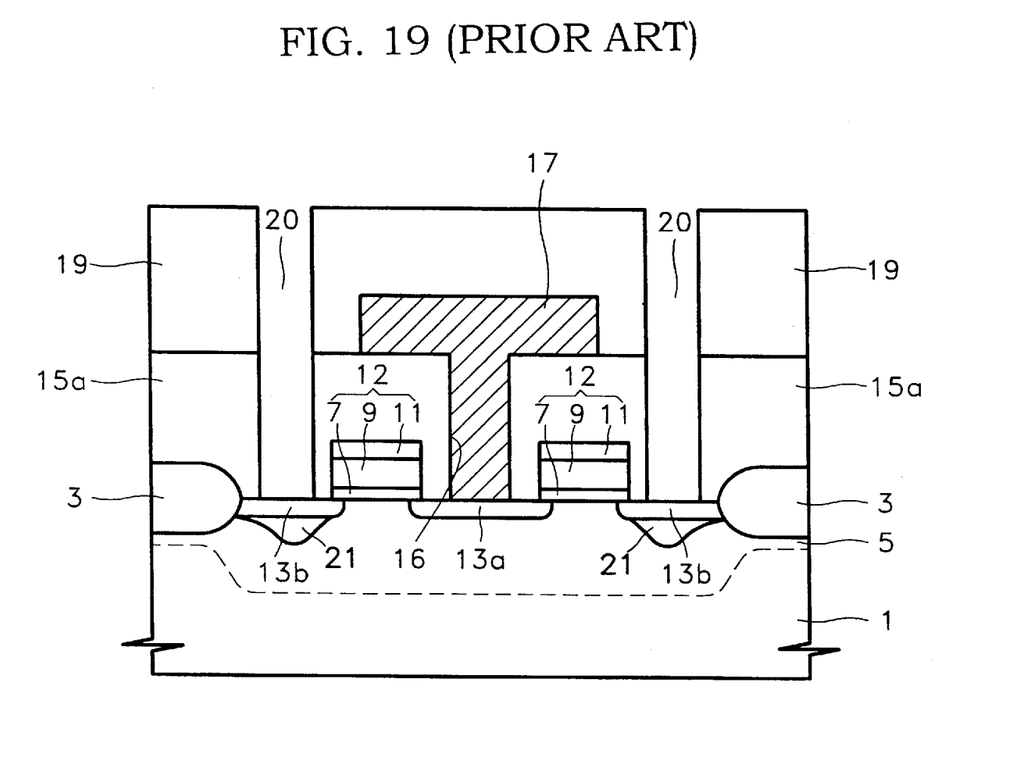
FIG. 19 illustrates a schematic cross-sectional view of a DRAM memory cell according to the prior art.

Another attempt at implanting plug ions into a memory cell's contact regions to reduce leakage currents is illustrated by FIG. 19. Here, a field ion region 5 of second conductivity type is provided to improve the isolation characteristics in a substrate region 1 of first conductivity type. However, as will be understood by those skilled in the art, the inclusion of a field ion region 5 may result in the formation of parasitic electric fields at the edges of a plurality of field oxide isolation regions 3, at the boundary between the field ion region 5 and a source/storage electrode contact region 13b of a memory cell. Such parasitic electric fields typically cause an increase in leakage currents and concomitant deterioration in a memory cell's refresh characteristics. To reduce these leakage currents, impurity regions 21 have typically been formed in the field ion region 5 by implanting dopants of first conductivity type into the storage electrode contact regions 13b. These impurity regions 21 also typically remedy the adverse consequences of etching damage which may occur in the substrate 1 during the formation of a plurality of storage electrode contact holes 20. In particular, the impurity regions 21 are typically formed so as to extend through the storage electrode contact regions 13b and into the field ion region 5 so that junction leakage current at the edges of the field oxide isolation regions 3 can be reduced.

A method of forming the memory device of FIG. 19 includes the steps of forming field oxide isolation regions 3 at a face of a semiconductor substrate 1 of first conductivity type and then implanting dopants of second conductivity type into the face of the semiconductor substrate to define a field ion region 5 therein, using the field oxide isolation regions 3 as an implant mask. Here, the energy at which the field ion region dopants are implanted is preferably selected so that at least some of the dopants implanted into the field oxide isolation regions 3 actually penetrate the field oxide isolation regions and enter underlying portions of the substrate 1, as illustrated. Next, a composite of a gate oxide layer, a conductive layer (e.g., doped or undoped polycrystalline silicon) and a capping oxide layer are formed in sequence on the face of the substrate 1. This composite of layers is then patterned using conventional techniques to define a plurality of insulated gate electrodes 12. These insulated gate electrodes 12 each comprise a gate oxide 7, gate electrode 9 and oxide cap 11. Dopants of first conductivity type are then implanted into the field ion region 5, using the insulated gate electrodes 12 as an implant mask. This implanting step is preferably performed to define self-aligned source/storage electrode contact regions 13b and self-aligned drain/bit line contact regions 13a.

A blanket first electrically insulating layer 15a (e.g., first passivation layer) is then formed on the insulated gate electrodes 12 and field oxide isolation regions 3. A bit line contact hole 16 is then formed in the first electrically insulating layer 15a, to expose a bit line contact region 13a. A bit line 17 is then patterned in the bit line contact hole 16. Next, a second electrically insulating layer 19 is formed on the first electrically insulating layer 15a. Storage electrode contact holes 20 are then formed in the second and first electrically insulating layers using conventional techniques. These storage electrode contact holes are preferably defined so that central portions of the storage electrode contact regions 13b are exposed at the face. Dopants of first conductivity type are then implanted through the storage electrode contact holes to define the above-described impurity regions 21. Although not shown, a storage electrode of a storage capacitor is then patterned in the contact holes 20.

Unfortunately, although the impurity regions 21 may reduce leakage currents at the edges of the field oxide isolation regions 3, junction leakage currents at other locations may still be present. In addition, as field oxide isolation regions are reduced in thickness as integrated circuit memory devices are scaled to smaller dimensions, the electrical isolation capability of the field oxide isolation regions is reduced. To compensate for this reduction in isolation capability, the dopant concentration in the field ion region typically has to be increased and the energy at which such dopants are implanted typically has to be decreased. However, these changes in the depth and dopant concentration of the field ion region typically cause a deterioration in a memory cell's refresh characteristics.

Thus, notwithstanding the above described methods of forming memory devices such as DRAM memory devices, there continues to be a need for improved methods of forming integrated circuit memory devices having improved refresh characteristics.

SUMMARY OF THE INVENTION

It is therefore an object of the present invention to provide improved methods of forming integrated circuit memory devices.

It is another object of the present invention to provide methods of forming integrated circuit memory devices having improved memory refresh characteristics.

It is still another object of the present invention to provide methods of forming integrated circuit memory devices which are less susceptible to etching damage caused during formation of storage electrode contact holes.

These and other objects, features and advantages of the present invention are provided by methods of forming integrated circuit memory devices, such as DRAM memory cell arrays, which include the steps of forming deep storage electrode contact regions to improve the refresh characteristics of memory devices. According to one embodiment of the present invention, a preferred method includes the steps of forming field oxide isolation regions at a face of a semiconductor substrate of first conductivity type, to define a memory cell array region therein. A field ion region of second conductivity type is then formed in the memory cell array region by implanting second conductivity type dopants into the substrate, using the field oxide isolation regions as an implant mask. An array of memory cells are then formed in the field ion region. These memory cells preferably contain storage electrode contact regions and bit line contact regions of first conductivity type. These contact regions form P-N junctions with the field ion region.

A first electrically insulating layer is then formed on the memory cells. Bit line contact holes are formed in the first electrically insulating layer to expose the bit line contact regions and then a plurality of bit lines are patterned into the bit line contact holes. A second electrically insulating layer is then deposited on the first electrically insulating layer and the bit lines. Storage electrode contact holes are then formed in the first and second electrically insulating layers to expose the storage electrode contact region. A plurality of storage electrodes are then patterned into the storage electrode contact holes.

According to a preferred aspect of the present invention, dopants of first conductivity type are then implanted through the storage electrode contact holes and into the storage electrode contact regions at a first energy in a range between about 60 and 150 KeV and at a first dose level in a range between $1 \times 10^{12}$ cm$^{-2}$ and $1 \times 10^{14}$ cm$^{-2}$. Then, dopants of first conductivity type are again implanted through the storage electrode contact holes and into the storage electrode contact regions at a second higher energy in a range between about 200 and 450 KeV and at a second dose level in a range between $1 \times 10^{12}$ cm$^{-2}$ and $1 \times 10^{14}$ cm$^{-2}$. In particular, these dual implanting steps are preferably performed to define deep storage electrode contact extensions which extend through the field ion region and form nonrectifying junctions with the semiconductor substrate. These storage electrode contact extensions improve the refresh characteristics of the memory cells in the array by compensating for parasitic electric fields generated adjacent the field oxide isolation regions and etching damage which may occur in the field ion region during the step of forming storage electrode contact holes.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type and each embodiment described and illustrated herein includes its complementary embodiment as well.

Figure 7:
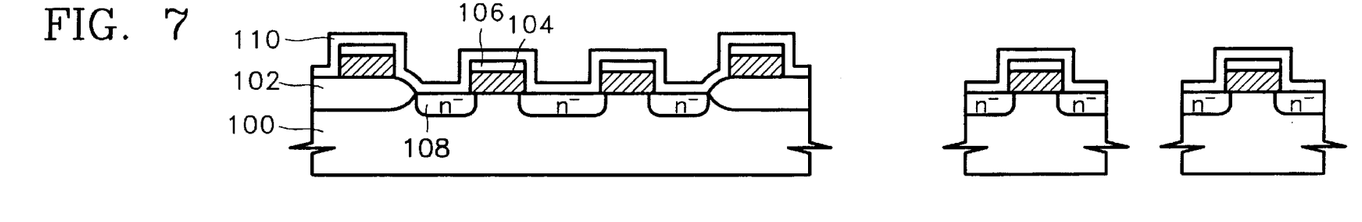
FIGS. 7–11 illustrate schematic cross-sectional views of intermediate structures illustrating a method of forming an integrated circuit memory device according to a first embodiment of the present invention.

Referring now to FIGS. 7–11, a method of forming an integrated circuit memory device according to a first embodiment of the present invention will now be described. In particular, FIG. 7 illustrates an intermediate structure of an integrated circuit memory device having a memory cell array region wherein DRAM memory cells are to be formed and a peripheral circuit region wherein peripheral devices are to be formed including NMOS and PMOS transistors. A method according to a first embodiment of the present invention includes the steps of forming a first insulating layer (e.g., $SiO_2$) on a face of a semiconductor substrate 100 of predetermined conductivity type (e.g., P-type). In the peripheral circuit region, the first insulating layer may comprise a gate oxide layer of predetermined thickness, as will be understood by those skilled in the art. However, in the cell array region, the first insulating layer is preferably formed on a portion of the face of the substrate 100 commonly referred to as an active region. This active region is defined by an opening in a field oxide isolation region 102. The first insulating layer may be a layer of deposited or thermally grown silicon dioxide. A conductive layer and capping oxide layer are then formed on the first insulating layer and patterned using conventional techniques to form a plurality of insulated electrodes 104 having oxide caps 106. As described more fully hereinbelow, the insulated electrodes 104 may be patterned as word lines which extend in a third dimension (not shown) to interconnect adjacent memory cells. In the peripheral circuit region, the insulated electrodes 104 may be patterned as insulated gate electrodes of the NMOS and PMOS transistors.

According to a preferred aspect of the present invention, the conductive layer may be formed as a composite layer of polycrystalline silicon and tungsten silicide ($WSi_x$). Dopants of first conductivity type (e.g., N-type) are then implanted into the face of the substrate 100 to form a plurality of preliminary contact regions 108 of first conductivity type in the cell array region and a plurality of LDD source and drain regions in the peripheral circuit region. These first conductivity type dopants are implanted in a self-aligned manner using the insulated electrodes 104 as an implant mask. Referring still to FIG. 7, a blanket second electrically insulating layer 110 (e.g., $SiO_2$) is then formed on the preliminary contact regions 108, the LDD source and drain regions and on the insulated electrodes 104. This blanket second electrically insulating layer 110 may have thickness in a range between about 1500 and 2000 Å.

Figure 8:
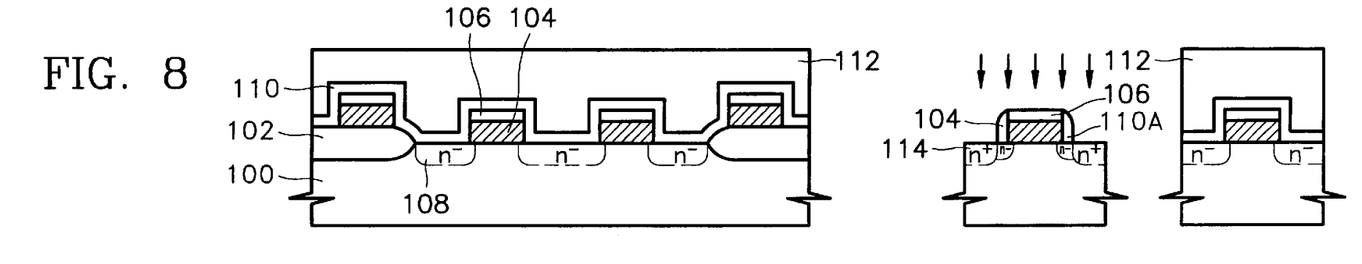
Figure 9:
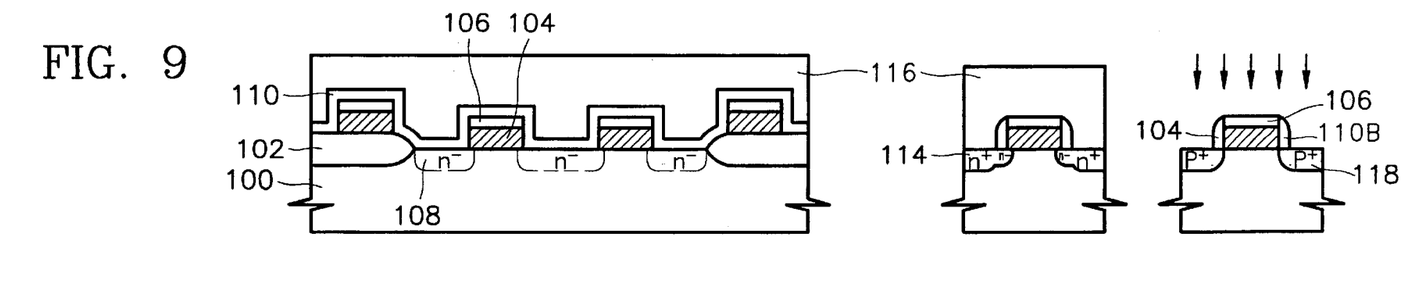

Referring now to FIG. 8, a first layer of photoresist 112 is then patterned to expose the portion of the substrate where NMOS transistors are to be formed. A selective etching step is then performed to convert an exposed portion of the second electrically insulating layer 110 to sidewall spacers IIA and then source and drain regions 114 (shown as N+) are formed by implanting first conductivity type dopants into the LDD source and drain regions, using the exposed insulated gate electrode 104 and sidewall spacers 110A as an implant mask. Referring now to FIG. 9, a second layer of photoresist 116 is then patterned to expose the portion of the substrate where PMOS transistors are to be formed. A selective etching step is then performed again to convert an exposed portion of the second electrically insulating layer 110 to sidewall spacers 110B and then source and drain regions 118 (shown as P+) are formed by implanting second conductivity type dopants into the LDD source and drain regions, using the exposed insulated gate electrode 104 and sidewall spacers 110B as an implant mask.

Figure 10:
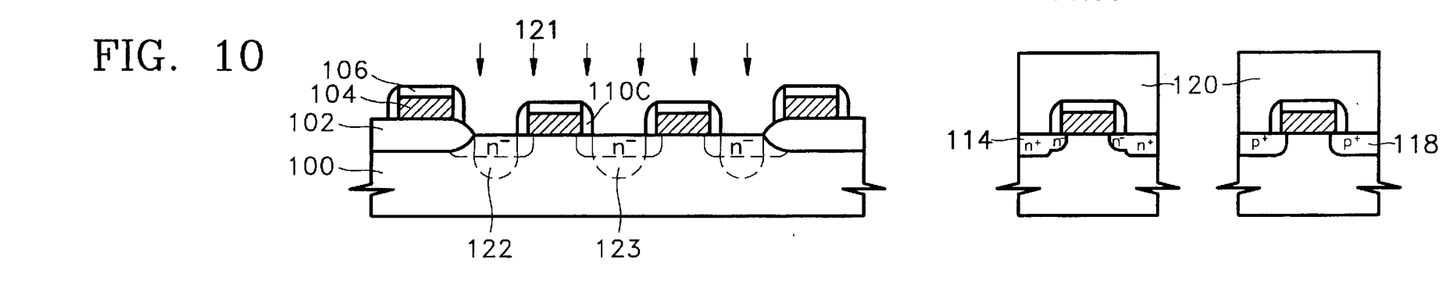
Figure 11:
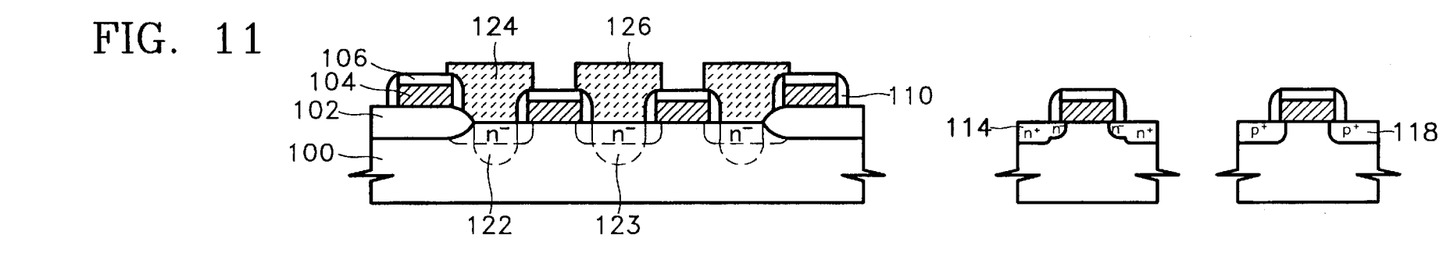

Referring now to FIG. 10, a third layer of photoresist 120 is then patterned as a mask to expose the cell array region. A selective etching step (e.g., reactive ion etching (RIE)) is then performed to convert an exposed portion of the second electrically insulating layer 110 to sidewall spacers 110C. Cell plug ions 121 are then implanted into the preliminary contact regions 108 using the sidewall spacers 110C as an implant mask. The step of implanting cell plug ions 121 preferably includes the step of implanting phosphorus ions at an energy in a range between about 40 and 60 KeV and at a dose level in a range between about $4 \times 10^{12}$ cm$^{-2}$ and $1 \times 10^{13}$ cm$^{-2}$. This second implanting step is preferably undertaken to form a more highly doped storage electrode contact region 122 and a more highly doped bit line contact region 123. These regions 122 and 123 can contribute to a recovery of etching damage generated in the substrate 100 during the formation of the sidewall spacers 110C, the field oxide isolation region 102, and to a reduction in junction leakage current which improves the memory device's refresh characteristics. Referring now to FIG. 11, the patterned layer of photoresist 120 is then removed, as illustrated. A conductive layer, which may comprise polysilicon of first conductivity type, is then deposited and patterned by etching to form a storage electrode pad 124 and bit line pad 126 as intermediate contacts. During subsequent processing, these pads 124 and 126 can be exposed by etching holes or vias in upper layers of insulation. An electrode of a storage capacitor and a bit line can then be patterned in the holes to electrically contact the pads 124 and 126. Alternatively, the pads 124 and 126 may also constitute the electrodes of a storage capacitor and the bit line, respectively.

Figure 12:
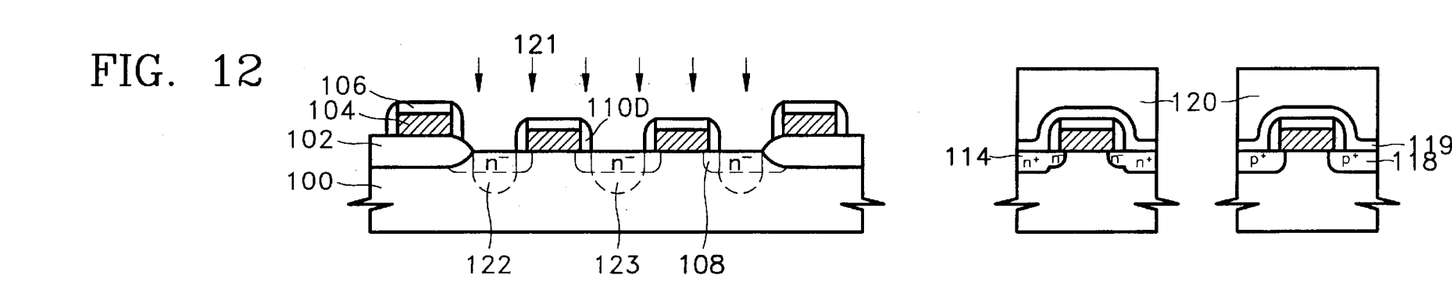
FIG. 12 illustrates a schematic cross-sectional view of an intermediate structure which when combined with FIGS. 7–9 and 11 illustrates a method of forming an integrated circuit memory device according to a second embodiment of the present invention.

As illustrated best by FIG. 12, the step of patterning the layer of photoresist 120 may be preceded by the step of forming another electrically insulating layer 119 in accordance with a second embodiment of the present invention. This electrically insulating layer 119 covers structures located in the peripheral circuit region. The selective etching step (e.g., reactive ion etching (RIE)) described with respect to FIG. 10 can then performed to convert the exposed portion of the electrically insulating layer 119 and the underlying second electrically insulating layer 110 to sidewall spacers 110D. As will be understood by those skilled in the art, the electrically insulating layer 119 can be used to protect the devices in the peripheral circuit region from damage when the conductive layer is etched to form the storage electrode and bit line pads 124 and 126 illustrated by FIG. 11.

Figure 13:
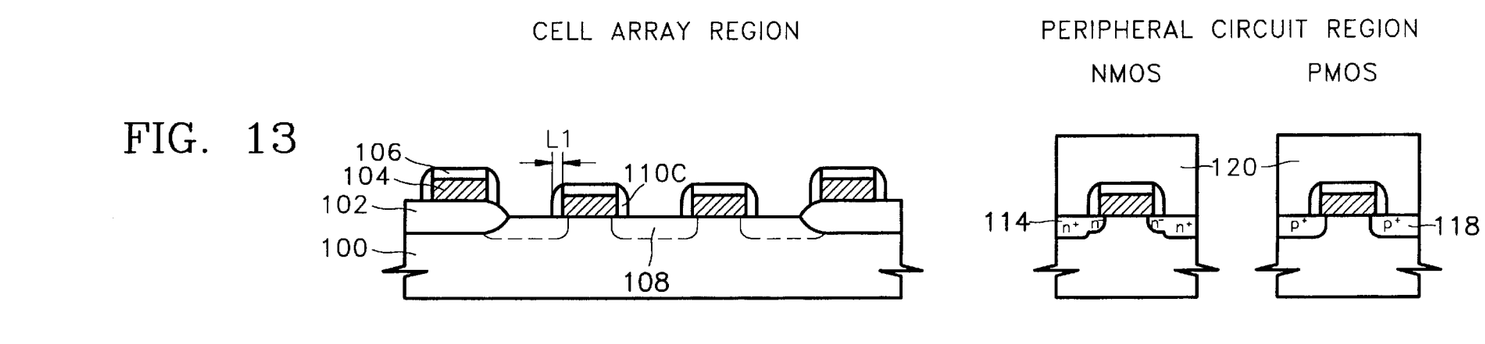
FIGS. 13–15 illustrate schematic cross-sectional views of intermediate structures which when combined with FIGS. 7–9 illustrate a method of forming an integrated circuit memory device according to a third embodiment of the present invention.
Figure 14:
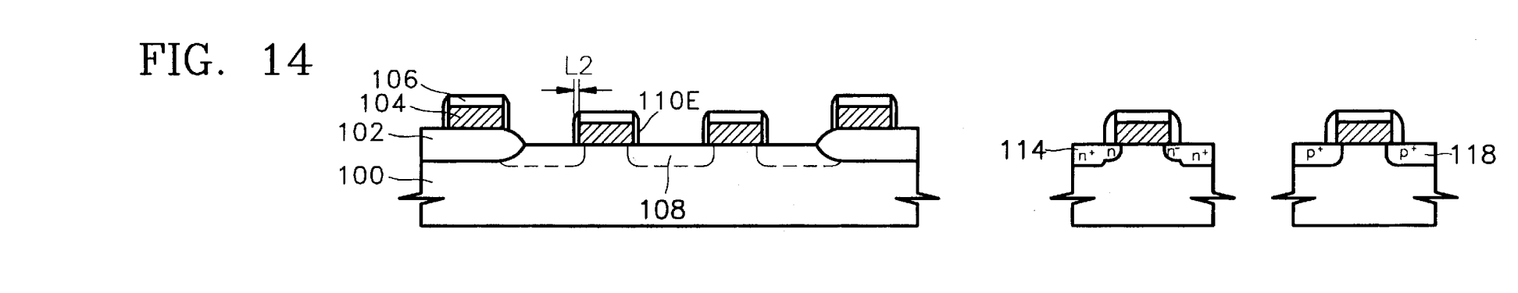
Figure 15:
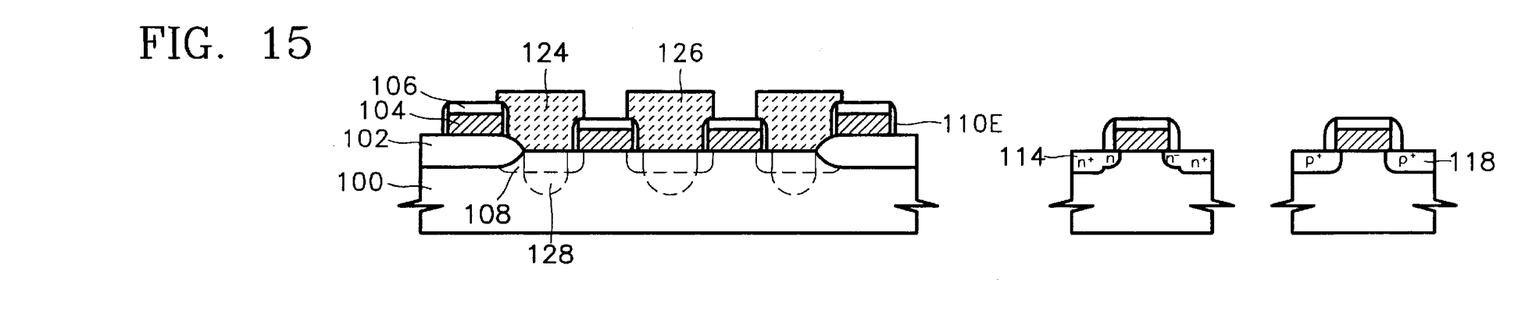

Referring now to FIGS. 13–15, methods of forming integrated circuit memory devices according to a third embodiment of the present invention will now be described. In particular, as best illustrated by FIGS. 13–14, the transverse cross-sectional widths "L1" of the sidewall spacers 110C are preferably reduced to less than about 50 Å (i.e., "L2" ≤50 Å) by performing a wet etching step using a solution containing HF. This increases the exposed area of the preliminary storage electrode and bit line contact regions 108. Then, as best illustrated by FIG. 15, first conductivity type dopants are diffused from the pads 124 and 126 into the preliminary contact regions 108 to form contact regions 128 which preferably have a sheet resistance in a range between about 120 to 180 Ω/□. This step of diffusing dopants from the pads into the preliminary contact regions 108 can be used in place of the step of performing the second implantation of plug ions 121, as illustrated by FIG. 10. The step of diffusing dopants instead of implanting dopants also reduces the amount of damage in the substrate 100 and this typically improves the memory cell's refresh characteristics. Moreover, by thinning the initial sidewall spacers 110C to form final sidewall spacers 110E, the contact resistances between the storage electrode and bit line pads 124 and 126 and the contact regions 128 can also be reduced. The ability to carefully control the amount of dopant diffused from the pads into the substrate 100 also allows the refresh characteristics to be carefully controlled.

Figures 16, 17:
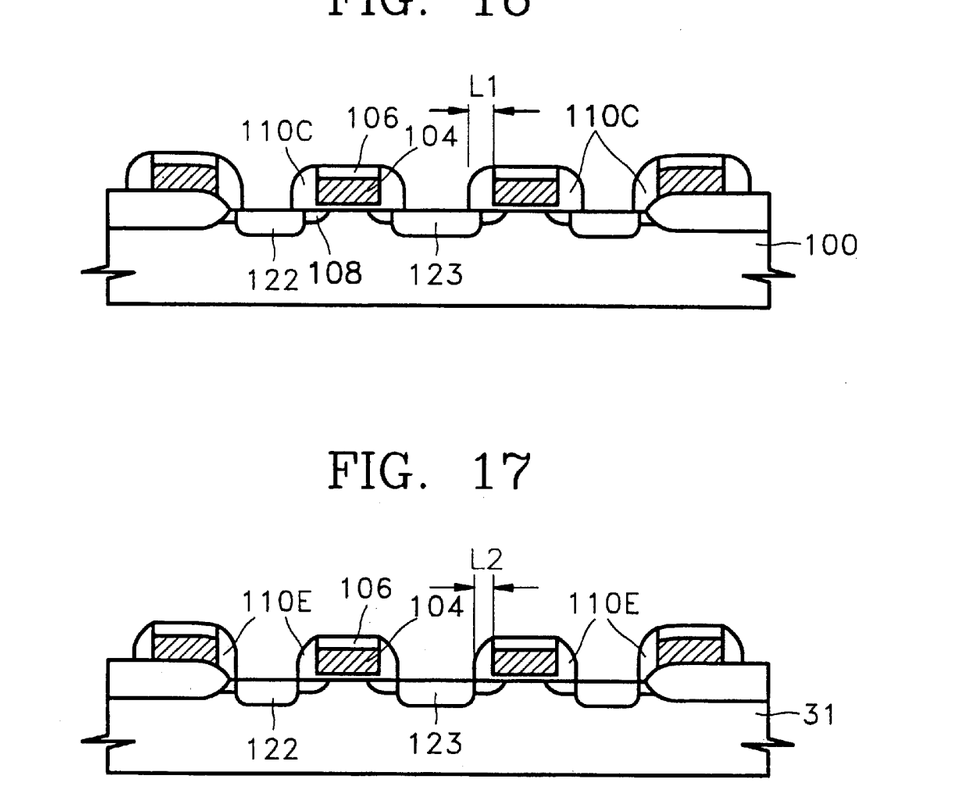
FIGS. 16–18 illustrate schematic cross-sectional views of intermediate structures which when combined with FIGS. 7–9 illustrate a method of forming an integrated circuit memory device according to a fourth embodiment of the present invention.
Figure 18:
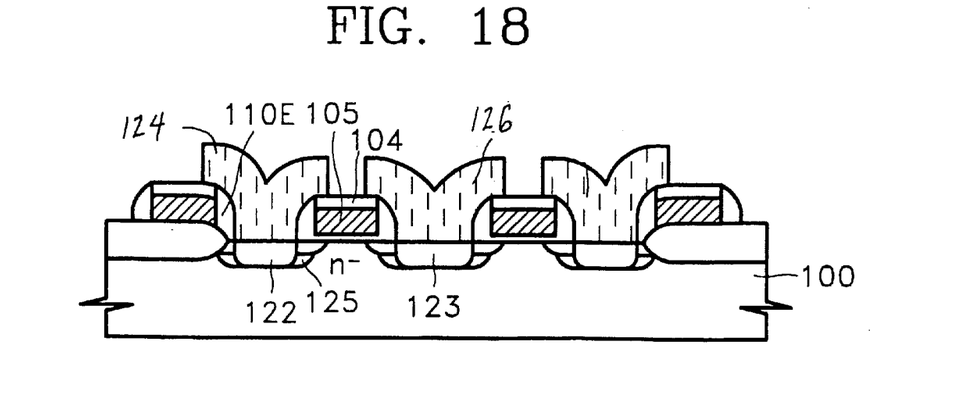

Referring now to FIGS. 16–18, methods of forming integrated circuit memory devices according to a fourth embodiment include steps from the first and third embodiments. In particular, as illustrated by FIGS. 10 and 16, the contact regions 122 and 123 may be formed by performing a second implant of first conductivity type dopants into the preliminary contact regions 108. Then, as illustrated by FIGS. 14 and 17, the sidewall spacers 110C can be thinned so that "L2" is less than about 50 Å, using a wet etching step. Finally, as illustrated by FIGS. 15 and 18, first conductivity type dopants are diffused from the pads 124 and 126 into the contact regions 122 and 123, as illustrated by regions 125.

Figure 20A:
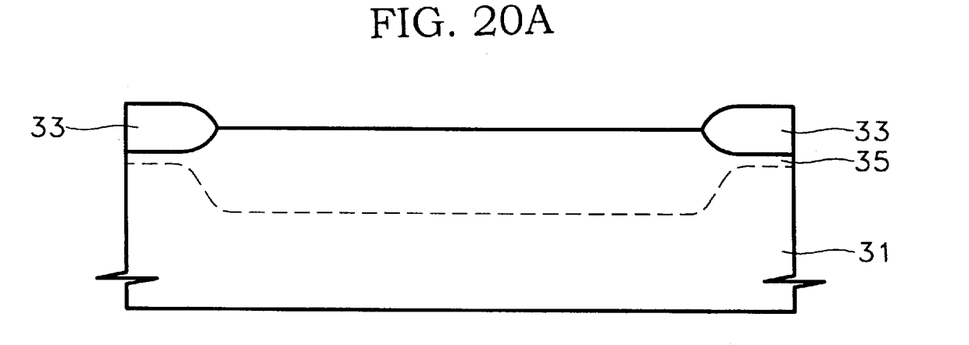
FIGS. 20A–20E illustrate schematic cross-sectional views of intermediate structures illustrating a method of forming an integrated circuit memory device according to a fifth embodiment of the present invention.
Figure 20B:
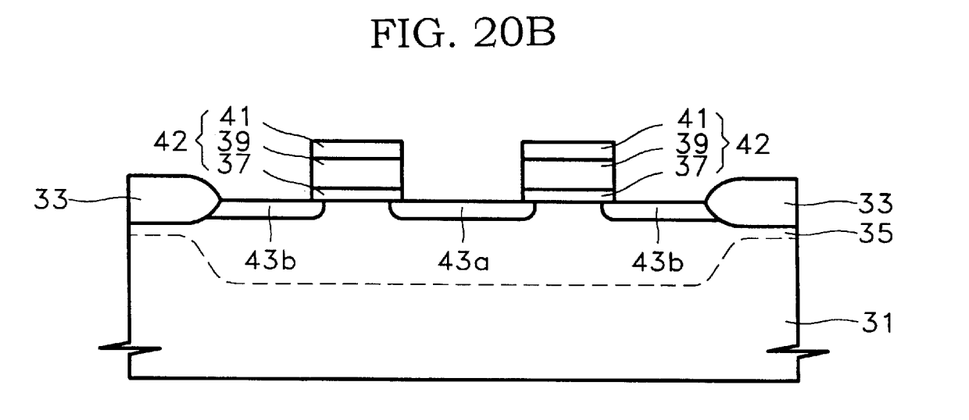

Referring now to FIGS. 20A–20E, methods of forming integrated circuit memory devices according to a fifth embodiment include the steps of forming field oxide isolation regions 33 at a face of a semiconductor substrate 31 of first conductivity type (e.g., N-type). These field oxide isolation regions 33 define a memory cell active region in the substrate, at the face thereof. A field ion region 35 of second conductivity type is then formed in the substrate 31 by implanting dopants of second conductivity through the field oxide isolation regions 33. These dopants are preferably implanted at sufficient energy so that at least a relatively small percentage fully penetrate the field oxide isolation regions 33 and enter the substrate 31, as illustrated. In particular, boron (B) atoms may be implanted at an energy in a range between 90 and 150 KeV and at a dose level in a range between $3\times10^{12}$ cm$^{-2}$ and $3\times10^{13}$ cm$^{-2}$. Referring now to FIG. 20B, a plurality of insulated gate electrodes 42 are then formed on the face of the semiconductor substrate 31, opposite the field ion region 35. These insulated gate electrodes 42 may be formed by depositing a gate oxide layer 37, a polysilicon gate electrode layer 39 and a capping oxide layer 41 in sequence, and then patterning these layers using conventional techniques to define the insulated gate electrodes 42. Source/storage electrode contact regions 43b and drain/bit line contact regions 43a are then formed in the field ion region 35 by implanting dopants of first conductivity type (e.g., phosphorus) into the face, using the insulated gate electrodes 42 as an implant mask.

Figure 20C:
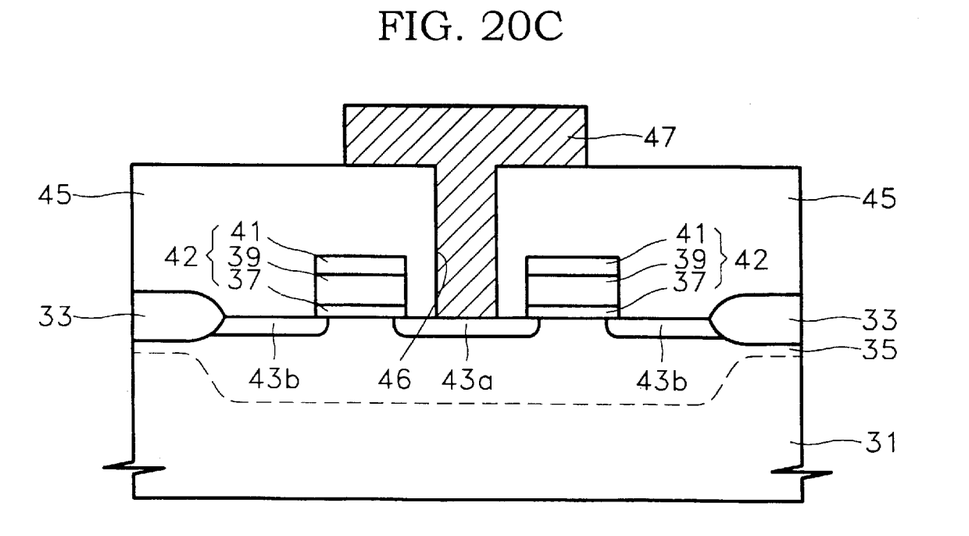
Figure 20D:
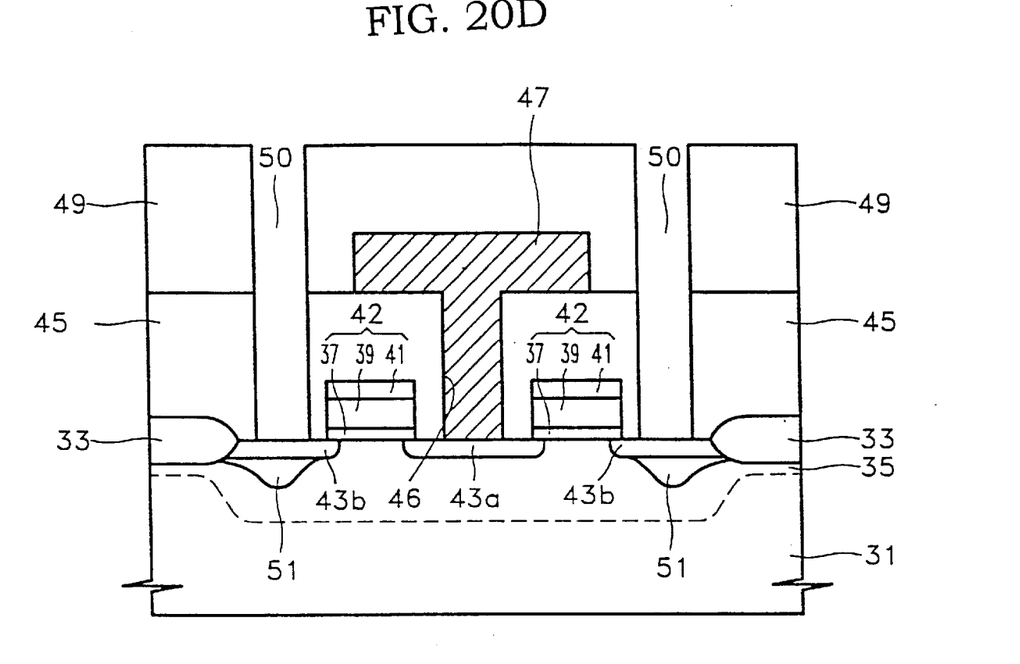

A first electrically insulating layer 45 (e.g., SiO$_2$) is then formed on the field oxide isolation regions 33, the face and the insulated gate electrodes 42, as illustrated best by FIG. 20C. A bit line contact hole 46 is then defined in the first electrically insulating layer 45, to expose the bit line contact region 43a. A bit line 47 is then patterned in the bit line contact hole 46 using conventional techniques. Referring now to FIG. 20D, a second electrically insulating layer 49 (e.g., SiO$_2$, borophosphosilicate glass (BPSG)) is then formed on the first electrically insulating layer 45, as illustrated by FIG. 20D. The first and second electrically insulating layers 45 and 49 are then patterned using conventional techniques to define storage electrode contact holes 50. As illustrated, these storage electrode contact holes 50 expose central portions of the storage electrode contact regions 43b.

Figure 20E:
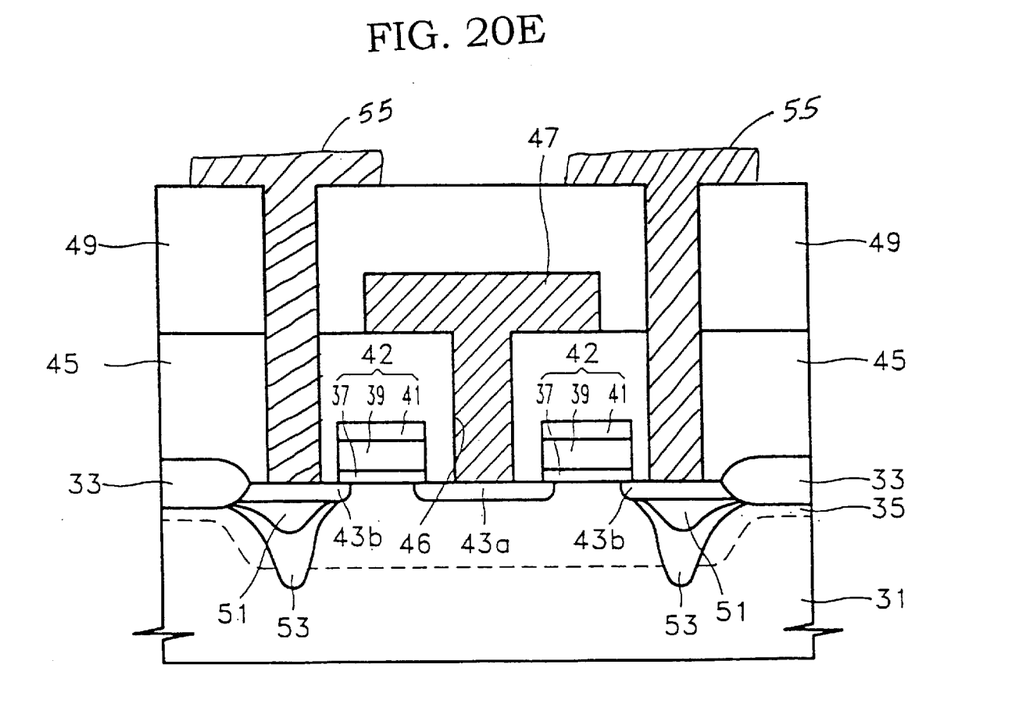

Referring now to FIG. 20E, first dopants of first conductivity type (e.g., phosphorus) are then implanted through the storage electrode contact holes 50 at a first energy in a range between about 60 and 150 KeV, to define first storage electrode contact extensions 51. Preferably, this step of implanting first dopants is performed at a dose level in a range between about $1\times10^{12}$ cm$^{-2}$ and $1\times10^{14}$ cm$^{-2}$. Thereafter, second dopants of first conductivity type (e.g., phosphorus) are implanted through the storage electrode contact holes 50 at a second higher energy in a range between about 200 and 450 KeV, to define second storage electrode contact extensions 53. This latter step of implanting second dopants is also performed at a dose level in a range between about $1\times10^{12}$ cm$^{-2}$ and $1\times10^{14}$ cm$^{-2}$. As illustrated, these second storage electrode contact extensions 53 extend through the field ion region 35 and form nonrectifying junctions (e.g., N+/N) with the semiconductor substrate 31. According to a preferred aspect of the present invention, the energies at which the first and second dopants are implanted is preferably selected in the above ranges so that even after the field ion region dopants diffuse into the substrate 31 during the steps illustrated by FIGS. 20B–D, at least the second dopants will be able to penetrate the field ion region 35. Moreover, these storage electrode contact extensions 51 and 53 improve the refresh characteristics of the memory cells in the array by compensating for parasitic electric fields generated adjacent the field oxide isolation regions 33 and etching damage which may occur in the field ion region 35 during the step of forming storage electrode contact holes 50. These extensions 51 and 53 also compensate for degraded refresh characteristics which may be caused by shallower and more highly doped field ion regions 35.

Referring still to FIG. 20E, storage electrodes 55 of respective storage capacitors are then patterned in the storage electrode contact holes 50 using conventional techniques. These storage electrodes are then covered by a dielectric layer (not shown) and plate electrodes (not shown) are then formed on the dielectric layer, opposite respective storage electrodes.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising the steps of:

forming a semiconductor substrate of first conductivity type comprising a field ion region of second conductivity type therein extending to a face thereof;

forming a memory cell having bit line and storage electrode contact regions of first conductivity type in the field ion region, adjacent the face;

implanting dopants of first conductivity type into the storage electrode contact region to define a storage electrode contact extension of first conductivity type therein which extends through the field ion region and forms a nonrectifying junction with the semiconductor substrate; and forming a storage electrode and bit line on the storage electrode contact region and bit line contact region, respectively.

2. The method of claim 1, wherein said implanting step comprises implanting first dopants of first conductivity type into the storage electrode contact region at a first energy in a range between about 60 and 150 KeV and implanting second dopants of first conductivity type into the storage electrode contact region at a second energy in a range between about 200 and 450 KeV.

3. The method of claim 2, wherein said steps of implanting dopants at first and second energies comprises implanting the first and second dopants at the first and second energies and at a dose level in a range between about $1 \times 10^{12}$ cm$^{-2}$ and $1 \times 10^{14}$ cm$^{-2}$.

4. The method of claim 1, wherein said step of forming a memory cell comprises the steps of:

forming an insulated gate electrode on the face of the semiconductor substrate, opposite the field ion region of second conductivity type; and implanting third dopants of first conductivity type into the field ion region to define bit line and storage electrode contact regions of first conductivity type therein, using the insulated gate electrode as an implant mask.

5. The method of claim 4, further comprising the steps of;

forming a first electrically insulating layer on the insulated gate electrode and the bit line and storage electrode contact regions;

forming a bit line contact hole in the first electrically insulating layer, to expose the bit line contact region; and patterning a bit line in the bit line contact hole.

6. The method of claim 5, further comprising the steps of:

forming a second electrically insulating layer on the first electrically insulating layer;

forming a storage electrode contact hole in the second electrically insulating layer and the first electrically insulating layer, to expose the storage electrode contact region; and patterning a storage electrode in the storage electrode contact hole.

7. The method of claim 6, wherein said implanting step comprises implanting dopants of first conductivity type through the storage electrode contact hole.

8. The method of claim 2, wherein said step of forming a memory cell comprises the steps of:

forming an insulated gate electrode on the face of the semiconductor substrate, opposite the field ion region of second conductivity type; and implanting third dopants of first conductivity type into the field ion region to define bit line and storage electrode contact regions of first conductivity type therein, using the insulated gate electrode as an implant mask.

9. The method of claim 8, further comprising the steps of:

forming a first electrically insulating layer on the insulated gate electrode and the bit line and storage electrode contact regions;

forming a bit line contact hole in the first electrically insulating layer, to expose the bit line contact region; and patterning a bit line in the bit line contact hole.

10. The method of claim 9, further comprising the steps of:

forming a second electrically insulating layer on the first electrically insulating layer;

forming a storage electrode contact hole in the second electrically insulating layer and the first electrically insulating layer, to expose the storage electrode contact region; and patterning a storage electrode in the storage electrode contact hole.

11. The method of claim 10, wherein said implanting step comprises implanting dopants of first conductivity type through the storage electrode contact hole.

12. The method of claim 2, wherein said step of forming a semiconductor substrate comprises the steps of, forming field oxide isolation regions at a face of a semiconductor substrate of first conductivity type, to define a memory cell array region therein; and implanting field ion region dopants of second conductivity type into the memory cell array region, using the field oxide isolation regions as an implant mask.

13. The method of claim 12, wherein said step of implanting field ion region dopants comprises implanting field ion region dopants through the field oxide isolation regions and into the semiconductor substrate.

14. A method of forming an integrated circuit memory device, comprising the steps of:

forming a semiconductor substrate of first conductivity type comprising a field ion region of second conductivity type therein extending to a face thereof;

forming a memory cell having bit line and storage electrode contact regions of first conductivity type in the field ion region, adjacent the face;

forming a first electrically insulating layer on the memory cell;

forming a storage electrode contact hole in the first electrically insulating layer, to expose the storage electrode contact region;

implanting first dopants of first conductivity type through the storage electrode contact hole and into the storage electrode contact region at a first energy in a range between about 60 and 150 KeV; implanting second dopants of first conductivity type through the storage electrode contact hole and into the storage electrode contact region at a second energy in a range between about 200 and 450 KeV; and forming a storage electrode and bit line on the storage electrode contact region and bit line contact region, respectively.

15. The method of claim 14, wherein said step of forming a memory cell comprises the steps of:

forming an insulated gate electrode on the face of the semiconductor substrate, opposite the field ion region of second conductivity type; and implanting third dopants of first conductivity type into the field ion region to define bit line and storage electrode contact regions of first conductivity type therein, using the insulated gate electrode as an implant mask.

16. The method of claim 15, further comprising the steps of:

forming a bit line contact hole in the first electrically insulating layer, to expose the bit line contact region; and patterning a bit line in the bit line contact hole.

17. The method of claim 16, further comprising the steps of:

forming a second electrically insulating layer on the first electrically insulating layer;

forming a storage electrode contact hole in the second electrically insulating layer and the first electrically insulating layer, to expose the storage electrode contact region; and patterning a storage electrode in the storage electrode contact hole.

18. A method of forming a semiconductor device, comprising the steps of:

forming a semiconductor substrate of first conductivity type comprising a field ion region of second conductivity type therein extending to a face thereof;

forming an insulated gate transistor having source and drain regions of first conductivity type in the field ion region, adjacent the face; and implanting dopants of first conductivity type into the source region to define a source extension of first conductivity type therein which extends through the field ion region and forms a nonrectifying junction with the semiconductor substrate.

19. The method of claim 18, wherein said implanting step comprises implanting first dopants of first conductivity type into the source region at a first energy in a range between about 60 and 150 KeV and implanting second dopants of first conductivity type into the source region at a second energy in a range between about 200 and 450 KeV.

* * * * *